United States Patent [19]

Akamatsu

[11] Patent Number: 5,258,823
[45] Date of Patent: Nov. 2, 1993

[54] ALIGNMENT SYSTEM

[75] Inventor: Takahiro Akamatsu, Tokyo, Japan

[73] Assignee: Canon Kabushiki Kaisha, Tokyo, Japan

[21] Appl. No.: 720,004

[22] Filed: Jun. 24, 1991

[30] Foreign Application Priority Data

Jun. 28, 1990 [JP] Japan ................... 2-168299

[51] Int. Cl.$^5$ ............................... G01B 11/14
[52] U.S. Cl. ....................... 356/375; 356/401
[58] Field of Search ............ 356/375, 399–401; 250/561, 562, 548; 355/43, 55

[56] References Cited

U.S. PATENT DOCUMENTS

4,853,880 8/1989 Akamatsu et al. ............ 356/400 X
4,887,904 12/1989 Nakazato ..................... 356/375

Primary Examiner—Richard A. Rosenberger
Assistant Examiner—K. P. Hantis
Attorney, Agent, or Firm—Fitzpatrick, Cella, Harper & Scinto

[57] ABSTRACT

An alignment system incudes a sensor device including a pair of a light emitting element and a light receiving element, for detecting an edge of a substrate without contact thereto; a driving device for supporting the substrate and for moving the substrate; and a control device for controlling the driving device so as to position the substrate, wherein the control device controls the driving device so that the sensor device produces an output of a level which is within a predetermined tolerance range with respect to a set level, and wherein the control device is operable to renew the set level at a predetermined timing on the basis of (i) a first output of the sensor device corresponding to an output of the sensor device as produced in a first state in which light from the light emitting element of the sensor device is received by the light receiving element of the sensor device without being blocked and (ii) a second output of the sensor device corresponding to an output of the sensor device as produced in a second state in which the light reception of the light receiving element is completely blocked.

5 Claims, 5 Drawing Sheets

ALIGNMENT SYSTEM

FIELD OF THE INVENTION AND RELATED ART

This invention relates to an alignment system for positioning a substrate at a predetermined site. As an example, the alignment system of the present invention is usable as a prealignment system in a semiconductor device manufacturing apparatus such as a mask aligner or in an inspection instrument, for positioning a substrate such as a disk-like semiconductor wafer at a predetermined site when the same is introduced into such apparatus or instrument.

When a wafer is introduced onto a wafer chuck of a mask aligner, it is necessary to position the wafer at a predetermined site and in a predetermined direction, beforehand. Conventionally, such preparatory positioning (prealignment) is carried out by using a cutout portion formed at the circumference of a wafer. Usually, such cutout portion is defined by cutting a portion of the circumference of the disk-like wafer along a straight line, and this cutout is called an "orientation flat". As the positioning method therefor, a mechanical method and a non-contact method are known, and recently, the latter is the prevailing positioning method.

Figure 1:
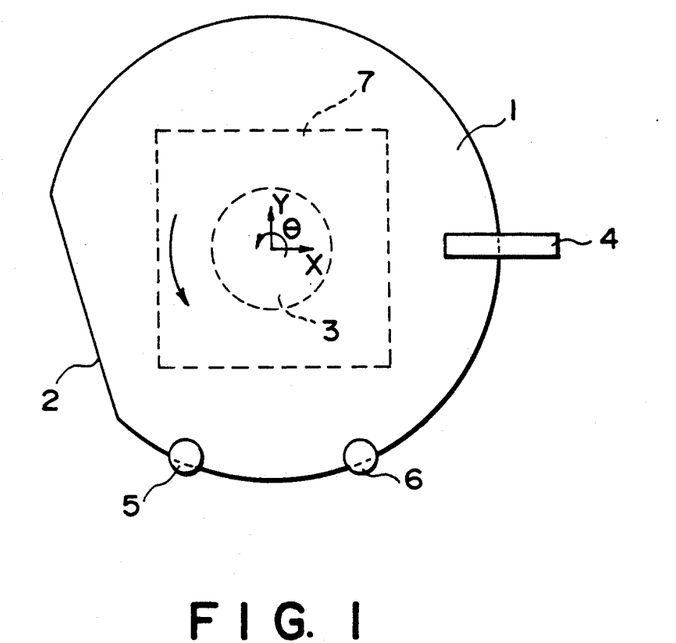
FIG. 1 is a top plan view of a non-contact prealignment system according to an embodiment of the present invention.
Figure 2:
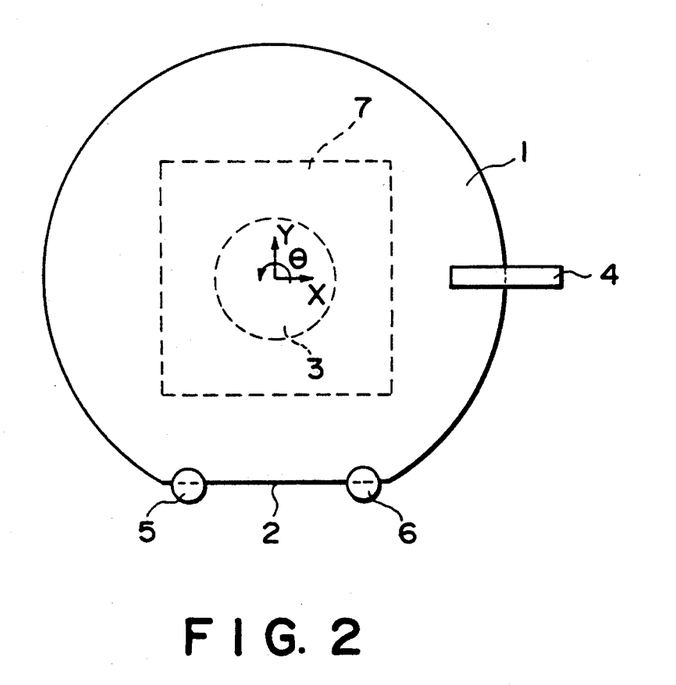
FIG. 2 is a top plan view of the non-contact prealignment system as the prealignment operation is completed.

Referring now to FIGS. 1 and 2, showing an embodiment of the present invention, the principle of the non-contact method will be briefly explained. First, a wafer 1 is placed on a wafer chuck 3 and it is attracted to the chuck by vacuum attraction. Then, it is rotationally moved in the $\theta$ direction. During this rotation, the position of an orientation flat 2 in the rotational ($\theta$) direction is detected on the basis of a change in the output of an X-axis positioning sensor 4, and the rotation is stopped as the flat 2 coincides with the Y-axis positioning sensors 5 and 6. Then, X-Y movable stage 7 which supports the wafer chuck 3 is moved in a Y-axis direction until each of the outputs of the Y-axis positioning sensors 5 and 6 becomes equal to a predetermined level (set level). Next, the X-Y movable stage 7 is moved in an X-axis direction until the output of the X-axis positioning sensor 4 comes equal to a predetermined level (set level). By these operations, the wafer is positioned at a set position and in a set direction with its orientation flat being used as a reference.

Figure 3:
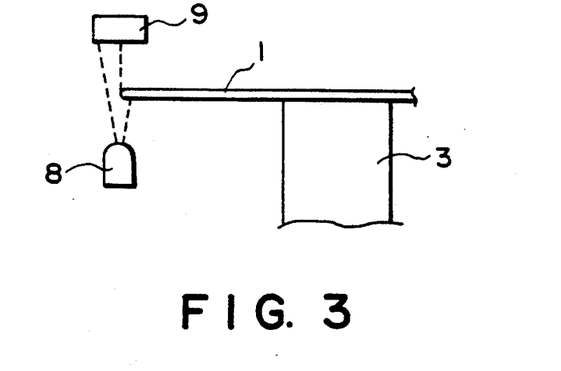
FIG. 3 is a sectional view of a positioning sensor means of the FIG. 1 embodiment.

Usually, the positioning sensors 4-6 each comprises a pair of a light emitting diode 8 and a photodetector 9 such as shown in FIG. 3. As the edge of the wafer 1 blocks the light path from the light emitting diode 8, the output of the photodetector 9 changes and the position of the wafer edge can be detected.

SUMMARY OF THE INVENTION

In the example described above, the positioning is effected by moving the X-Y movable stage 7 until each of the outputs of the positioning sensors 4-6 becomes equal to a predetermined level (set level). However, the light emitting diode 8 used in these sensors 4-6 has a characteristic that the quantity of emitted light decreases due to deterioration with age. This causes such inconveniences as follows.

(1) Even if the position as the wafer edge blocks the light path of the light emitting diode 8 is unchanged, there is a possibility that the output of the photodetector 9 changes due to a decrease in the quantity of emitted light. If, therefore, the X-Y movable stage 7 is moved until the outputs of the sensors reach their set levels, the position of the positioned wafer 1 is changeable.

(2) If the quantity of emitted light of the light emitting diode 8 decreases substantially, the resolution per one bit decreases since usually the output of the photodetector 9 is processed by analog-to-digital conversion. This ends in failure of precise positioning.

It is accordingly an object of the present invention to provide an alignment system by which high-precision positioning of a substrate such as a wafer, for example, at a predetermined site is attainable without being affected by a change in sensitivity of a used positioning sensor.

In accordance with an aspect of the present invention, there is provided an alignment system, comprising: sensor means including a pair of a light emitting element and a light receiving element, for detecting an edge of a substrate without contact thereto; driving means for supporting the substrate and for moving the substrate; and control means for controlling the driving means so as to position the substrate, wherein the control means controls the driving means so that the sensor means produces an output of a level which is within a predetermined tolerance range with respect to a set level, and wherein the control means is operable to renew the set level at a predetermined timing on the basis of (i) a first output of the sensor means corresponding to an output of the sensor means as produced in a first state in which light from the light emitting element of the sensor means is received by said light receiving element of the sensor means without being blocked and (ii) a second output of the sensor means corresponding to an output of the sensor means as produced in a second state in which the light reception of the light receiving element is completely blocked.

Preferably, the control means is further operable to renew the tolerance range on the basis of the first and second outputs of the sensor means. Preferably, the control means causes the light emitting element to be turned off when the sensor means is not used. Preferably, the control means includes means for holding the first output of the sensor means at a predetermined level.

In accordance with this aspect of the present invention, the set level for the output of a positioning sensor means or a tolerance range of it can be renewed on the basis of first and second outputs of the sensor means which correspond to those of the sensor means to be produced when light is received by a light receiving element of the sensor means with out being blocked and when the light reception is completely blocked, respectively. The renewing may be effected for each wafer, for example. Thus, even if there occurs deterioration of the positioning sensor means with aging, it is possible to attain precise positioning of a substrate, constantly, at a determined position and in a determined direction.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

FIG. 1 is a top plan view of a non-contact prealignment system according to an embodiment of the present invention. FIG. 2 is a top plan view of the non-contact prealignment system as the prealignment operation is completed. Denoted in these drawings at 1 is a wafer which is to be positioned. Denoted at 2 is an orientation flat to be used as a reference for the positioning; denoted at 3 is a chuck for attracting thereto the wafer 1 through vacuum attraction; and denoted at 4 is a positioning sensor having a function for detecting the position of the flat 2 in a rotational ($\theta$) direction as well as a function for detecting the position in an X-axis direction during the X-axis positioning operation. Denoted at 5 and 6 are positioning sensors for Y-axis positioning of the wafer 1; and denoted at 7 is an X-Y movable stage for carrying thereon the chuck 3 and being movable in the X-axis and Y-axis directions.

FIG. 3 shows details of the positioning sensor 4, 5 or 6. As illustrated, it comprises a light emitting diode (hereinafter "LED") 8 which serves as a light source, and a photodiode (light receiving element) 9 corresponding to the LED 8.

Figure 4:
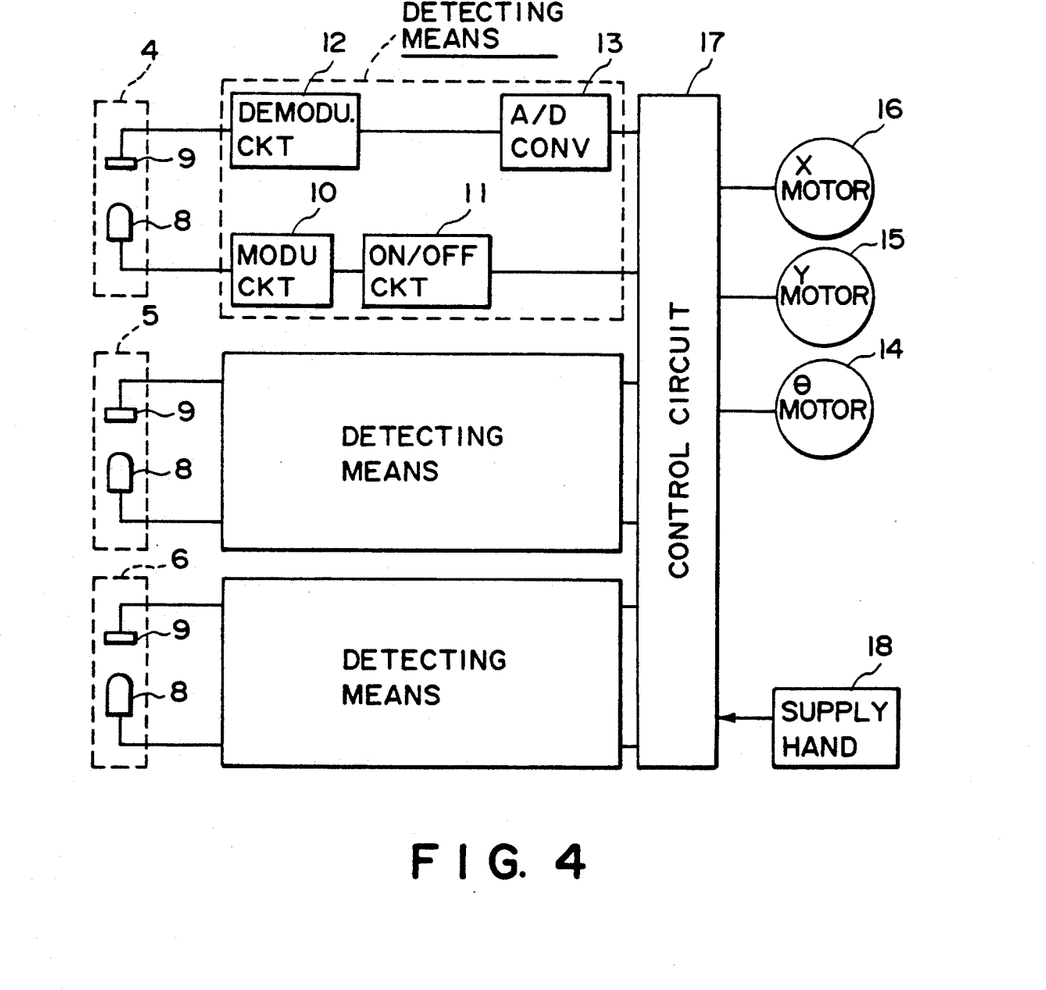
FIG. 4 is a block diagram of a control means of the FIG. 1 embodiment.

FIG. 4 is a block diagram of a control means usable in the prealignment system of FIG. 1. In FIG. 4, denoted at 10 is a modulating circuit for modulating the light output of the LED 8; denoted at 11 is an on/off circuit for turning on(off) the light output of the LED 8; denoted at 12 is a demodulating circuit for demodulating the output of the photodetector 9; denoted at 13 is an analog-to-digital converter (hereinafter "A/D converter") for analog-to-digital conversion of the demodulated output of the photodetector; denoted at 14 is a $\theta$-motor for rotational drive of the wafer chuck 3; denoted at 15 is a Y-motor for Y-axis movement of a Y-axis table of the X-Y stage 7; denoted at 16 is an X-motor for X-axis movement of an X-axis table of the X-Y stage 7; denoted at 17 is a control circuit for controlling the X, Y and $\theta$ motors 16, 15 and 14 on the basis of the analog-to-digital converted outputs of the three positioning sensors 4, 5 and 6; and denoted at 18 is a supply hand for introducing a wafer into the prealignment system.

Referring to the flow chart of FIG. 5, the prealignment operation for a wafer with the described structure will be explained.

In the wafer prealignment operation, first an instruction which represents that a wafer 1 is being introduced into the prealignment system, is signaled from the supply hand 18 to the control circuit 17 (step S1). At this stage, each of the sensors 4, 5 and 6 is in a complete reception state wherein the light reception of the photodetector is not blocked.

In response to the introduction signal, the control circuit 17 causes the on/off circuit 11 to turn off the LED 8 of each positioning sensor, and reads the output of the photodetector 9 of each positioning sensor. At this stage, the output of the photodetector 9 corresponds to one to be produced when the corresponding LED 8 is turned on but its light path is completely blocked by a wafer 1. Such photodetector output will be referred to as an output $E_{OFF}$ (step S2).

Then, the control circuit 17 causes the on/off circuit 11 to turn on the LED 8 of each positioning sensor. At this stage, each sensor is in the complete reception state (the light from the LED is received by the photodetector without being blocked by the wafer). The output of each photodetector 9 at this stage will be referred to as an output $E_{ON}$ (step S3).

Subsequently, by using the positioning sensor outputs $E_{OFF}$ and $E_{ON}$ obtained at steps S2 and S3, for each positioning sensor a set level $E_0$ for the positioning is determined in accordance with equation (1), below (step S4):

$$E_0 = \tfrac{1}{2} \times (E_{ON} + E_{OFF}) \qquad (1)$$

Also, for each positioning sensor, a run-in range (tolerance) of the X-Y movable stage 7 with respect to the set level is calculated (step S5). If a tolerance coefficient is denoted by T (%), the tolerance level $E_T$ is expressed by equation (2), below:

$$E_T = T/100 \times (E_{ON} - E_{OFF}) \qquad (2)$$

Next, when the wafer 1 is introduced by the hand 18 onto the wafer chuck 3 and it is attracted to the chuck 3 by vacuum attraction (step S6), the control circuit 17 causes the $\theta$-motor 14 to rotationally move the wafer chuck 3 at a constant speed. This causes rotation of the wafer 1. During the rotation, the output of the X-axis positioning sensor 4 is monitored. This output changes as a result of any eccentricity of the wafer 1 or of the passage of the orientation flat. Such change is detected by differentiation or the like. As the passage of the orientation flat through the position underneath the X-axis positioning sensor 4 is detected, the wafer chuck 3 is further rotated from that position by a predetermined amount and is stopped there. By this, the orientation flat is positioned, coinciding with the Y-axis positioning sensors 5 and 6 (step S7).

Thereafter, the Y-motor 15 is actuated to move the X-Y movable stage 7 in the Y-axis direction so as to assure that the outputs E of the sensors 5 and 6 each satisfy equation (3), below, which is determined by a corresponding set level $E_0$ (obtained at steps S4 and S5) and a corresponding tolerance $E_T$.

$$E_0 - E_T \leq E \leq E_0 + E_T \qquad (3)$$

Here, if necessary, the $\theta$-motor 14 may be actuated to rotationally move the wafer chuck 3 (step S8).

Then, the X-motor 16 is actuated to move the X-Y movable stage 7 in the X-axis direction so as to assure that also the output E of the X-axis positioning sensor 4 satisfies equation (3) (step S9).

Steps S8 and S9 may be repeated to assure that the outputs of all the positioning sensors 4–6 satisfy equation (3) (step S10). When this is accomplished, the positioning of the wafer 1 at a determined site and in a determined direction is completed with the orientation flat 2 being used as a reference.

After completion of the wafer positioning, the on/off circuit 11 holds each LED 8 turned off until a wafer introduction signal is subsequently applied to the control circuit 17 (step S11).

Figure 5:
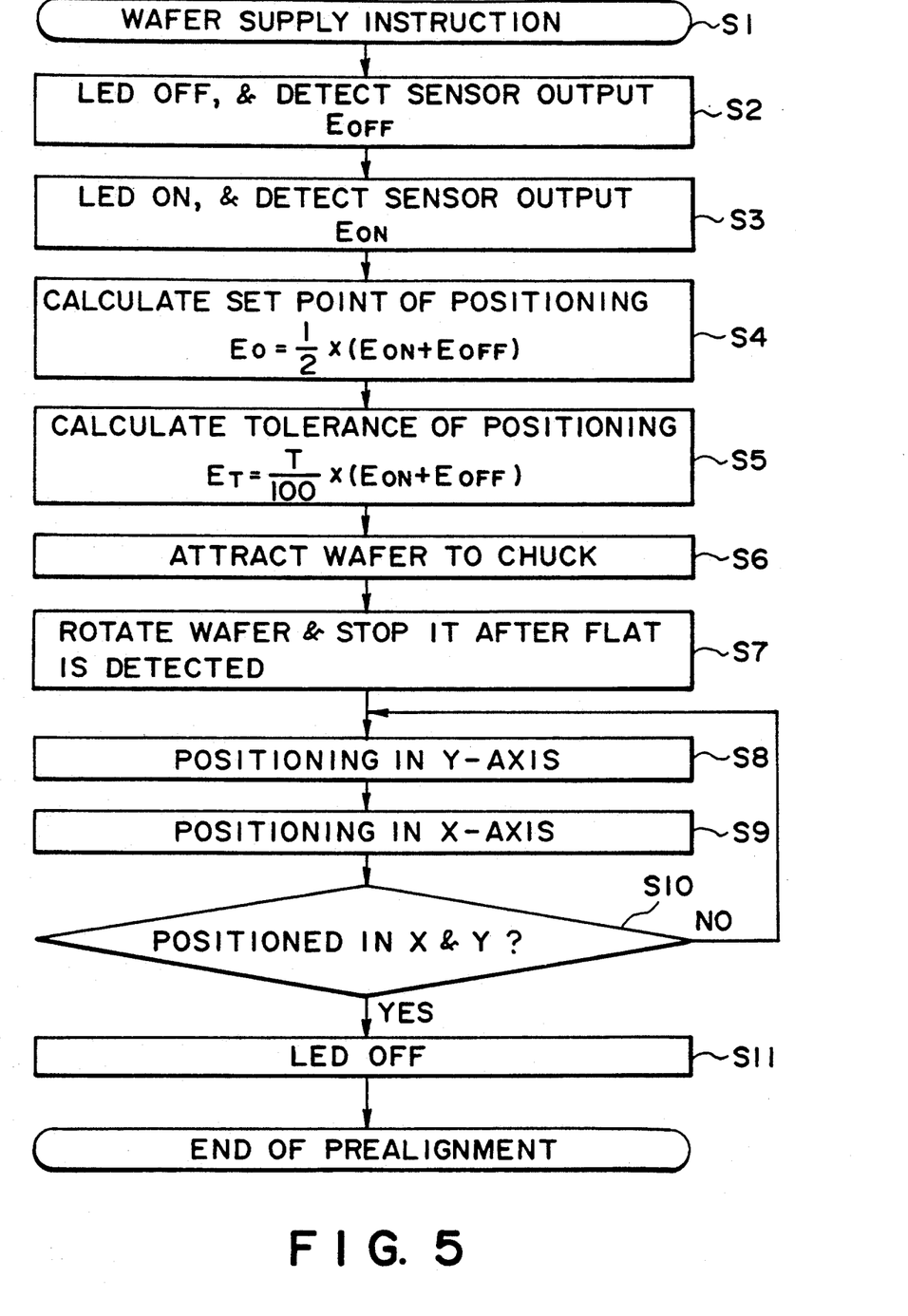
FIG. 5 is a flow chart of prealignment operation made by using the FIG. 1 embodiment.
Figure 6:
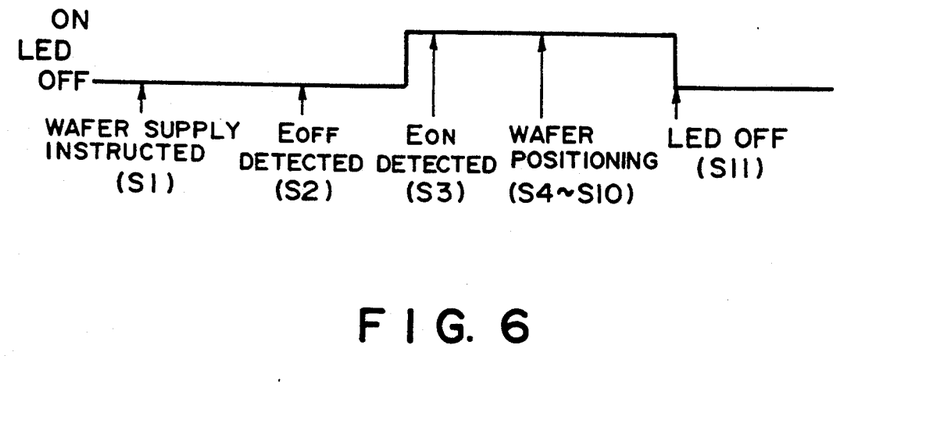
FIG. 6 is a timing chart of the operation of the sensor means of the FIG. 1 embodiment.

FIG. 6 illustrates changes in on/off state of the LED 8 with time, in relation to the steps of FIG. 5.

Specific advantageous effects of this embodiment will now be explained.

As a first point, the LED 8 used in each positioning sensor 4, 5 or 6 has such characteristic that the quantity of emitted light decreases gradually due to deterioration with age. For this reason, in the example described in the introductory part of the specification, even if the position as the light path of the positioning sensor is blocked by the wafer outer periphery is unchanged, the output of the positioning sensor decreases. In other words, even if the wafer is so positioned that the output of the positioning sensor becomes equal to a set level which is predetermined, the position of the positioned wafer is changeable. In the present embodiment, as compared therewith, for each of the positioning sensors 4–6, a half ($\frac{1}{2}$) of the sum of (i) a first output of that sensor corresponding to an output which is produced when the sensor is in the complete reception state (light from the LED is received by the photodetector without being blocked) and (ii) a second output of that sensor corresponding to an output which is produced when the sensor is in the completely blocked state (the light from the LED is not at all received by the photodetector), is used as a set level and this set level is renewed each time a fresh wafer is introduced. Additionally, the decrease in quantity of emitted light of the LED 8 is so small in a short time period necessary for the prealignment operation that it can be neglected. Therefore, the present embodiment assures the positioning of wafers at a constant position irrespective of a decrease in the quantity of emitted light of the LED 8 over a long time period.

As a second point, if there occurs a change in the sensitivity of the photodetector used in the positioning sensor 4, 5 or 6, in the example described in the introductory part of the specification, the position of the positioned wafer is changeable. In the present embodiment, as compared therewith, the half of the sum of the first and second outputs of the sensor is used as a set level and this set level is renewed for each wafer. Additionally, a change in sensitivity of the photodetector 9 is so small in a short time period necessary for the prealignment operation that it can be neglected. Therefore, the present embodiment assures the positioning of wafers at a constant position irrespective of a change in the sensitivity of the photodetector to be caused during a long time period.

As a third point, if in a long time period there occurs a change in an output (DC offset, gain or the like) of the demodulating circuit 12 (FIG. 4) or a change in DC offset or gain of the A/D converter 13, since such a change may be equivalent to a change in the output of the positioning sensor 4, 5 or 6, in the example described in the introductory part of the specification, also it results in a the changing of the position of a positioned wafer. In the present embodiment, however, since a half of the sum of the first and second outputs of the sensor is used as a set level and this is renewed for each wafer, such a change in the demodulating circuit 12 or in the A/D converter over a long time period does not prevents the positioning of wafers at a constant position.

As a fourth point, for each positioning sensor a tolerance $E_T$ is set with respect to a set level $E_0$ for the wafer positioning and the movement of the X-Y movable stage 7 is so controlled as to cause the output E of the positioning sensor to satisfy equation (3) above. If, in this case, an initial tolerance $E_T$ is so set to have a level corresponding to two bits of the A/D converter 13 and if there occurs deterioration with age of the LED 8 so that the quantity of emitted light thereof decreases to a half ($\frac{1}{2}$), then even the running-in into a range of $\pm 2$ bits of the A/D converter 13 will result in an error in the actual wafer position two times larger than that at the initial stage. Thus, the positioning precision will be degraded. In the present embodiment, however, for each positioning sensor the tolerance $E_T$ is determined by multiplying the difference between the first and second outputs of that positioning sensor by a tolerance coefficient T. Therefore, if at an initial stage the first output is $E_{ON}$ and said the second output is $E_{OFF}=0$, as an example, then it follows that:

$$E_T = T/100 \times (E_{ON} - E_{OFF}) = T/100 \times E_{ON} \quad (4)$$

If $E_{ON}$ changes to "$E_{ON} \times \frac{1}{2}$" due to deterioration with age, then the tolerance $E_T'$ is represented by:

$$E_T' = T/100 \times E_{ON} \times \frac{1}{2} = \frac{1}{2} \times E_T \quad (5)$$

That is, the tolerance is also reduced by half ($\frac{1}{2}$). It is seen from this that, if the tolerance coefficient is so set as to provide $\pm 2$ bit tolerance at the initial stage, then $\pm 1$ bit tolerance is assured when $E_{ON}$ is reduced to $\frac{1}{2}$ due to deterioration with age of the LED. Thus, there is an advantage that the actual positioning precision is not degraded.

As a fifth point, conventionally, an LED used in a positioning sensor is continuously held turned on and this hastens the decrease in the quantity of emitted light due to deterioration with age. In the present embodiment, as compared therewith, from the completion of the prealignment operation until the introduction of a succeeding wafer, the LED may be tuned off. This is effective to retard the decrease in quantity of emitted light and to assure high-precision positioning for a long time period.

Embodiment 2

Figure 7:
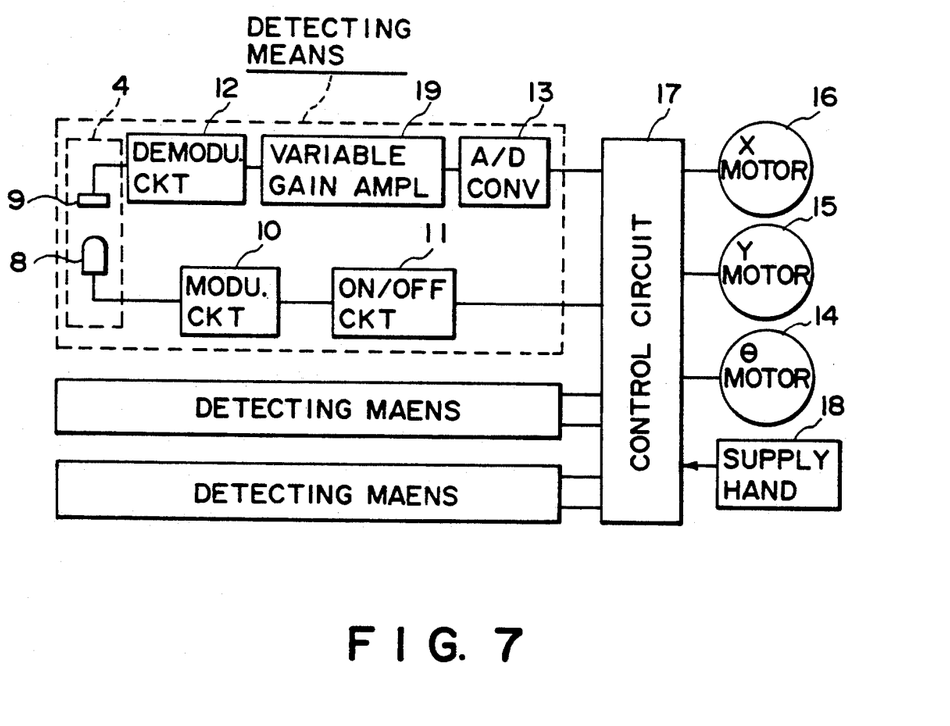
FIG. 7 is a block diagram of a control means of a prealignment system according to a second embodiment of the present invention.

FIG. 7 is a block diagram of a control means of a second embodiment of the present invention. The difference from the control means of FIG. 4 resides in the provision of a variable gain amplifier 19 between the demodulating circuit 12 and the A/D converter 13.

The wafer prealignment operation with this structure will now be explained. First, at an initial stage, the positioning sensors 4, 5 and 6 are placed in the complete reception state. Then, the variable gain amplifier 19 is set at its initial gain. This initial gain has such a level about which the gain of the amplifier can be increased and decreased. Additionally, through the A/D converters 13, the output of each positioning sensor is read and the read level is taken as an initial level $E_I$. Here, if the demodulating circuit 12 and the variable gain amplifier 19 as well as the A/D converter 13 are provided by high-precision parts in which DC drift is so small as can be neglected, the second output $E_{OFF}$ (corresponding to an output as produced when the light reception of the photodetector is completely blocked) can be regarded as $E_{OFF}=0$. Accordingly, while taking $E_{ON}=E_I$ (initial level) and $E_{OFF}=0$, a set level $E_0$ is determined in accordance with equation (1). Also, a tolerance $E_T$ is determined in accordance with equation (2). The obtained $E_0$ and $E_T$ are stored in a non-volatile memory or the like and they are stored semi-eternally. This is the initial setting.

In usual wafer prealignment operation, first an instruction representing the introduction of a wafer 1 is signaled from the supply hand 18 to the control circuit 17. At this stage, each of the positioning sensors 4-6 is held in the complete reception state. Then, the on/off circuit 11 operates to turn on a corresponding LED 8 of a corresponding positioning sensor. The variable gain amplifier 19 is so controlled that the output of each positioning sensor in this state becomes equal to the initial level ($E_I$). After the control is completed, the gain is fixed throughout the time period of this wafer prealignment operation.

The subsequent operations are similar to those made at step S6 and steps following it in the flow chart of FIG. 5 of the first embodiment, except for that the set level $E_0$ and the tolerance $E_T$ as stored in the non-volatile memory or the like are used.

In this embodiment, through the control under the variable gain amplifier 19, the same output level $E_{ON}$ (corresponding to an output as produced when the photodetector receives light without being blocked) is maintained. As a result, even if there occurs a decrease in the quantity of emitted light of the LED 8 of each positioning sensor due to deterioration with age, a change in the sensitivity of the photodetector 9 or a change in the gain of the demodulating circuit 12 or of the A/D converter 13 over a long time period, it is possible to attain high-precision positioning of wafers at a determined position and in a determined direction constantly. Further, there is an additional advantage that, once the set level ($E_0$) and the tolerance ($E_T$) are determined by the initial setting, it is not necessary to calculate them for each wafer.

Embodiment 3

Figure 8:
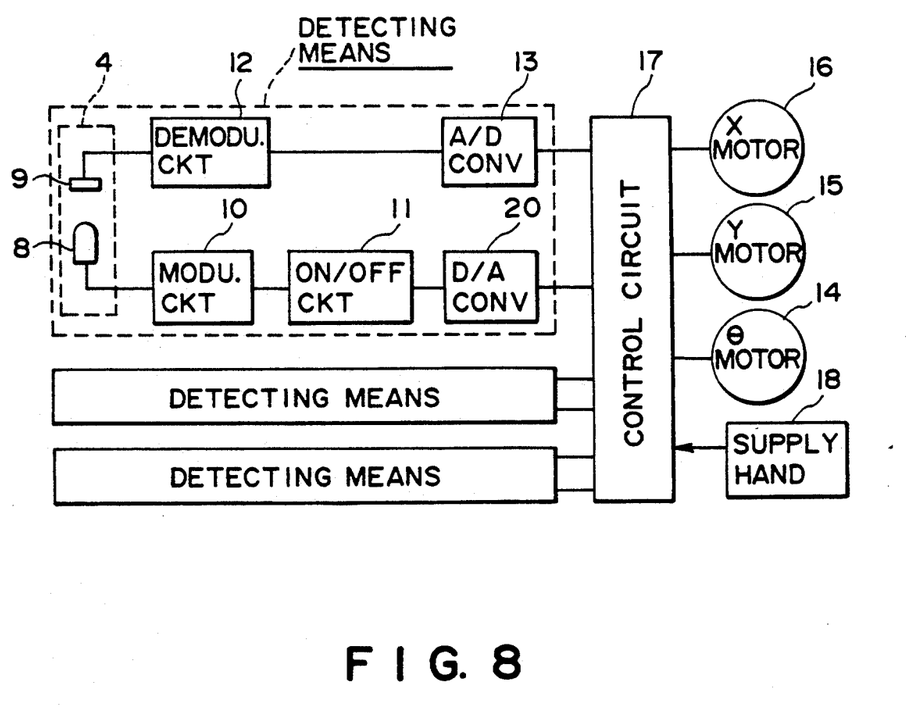
FIG. 8 is a block diagram of a control means of a prealignment system according to a third embodiment of the present invention.

FIG. 8 is a block diagram of a control means of a third embodiment of the present invention. The difference from the control means of the second embodiment (FIG. 7) resides in the provision of a digital-to-analog converter (hereinafter "D/A converter") 20 in place of the variable gain amplifier 19. The structure and operation of the remaining portion are essentially the same as the second embodiment. That is, while in the second embodiment the variable gain amplifier 19 is used to control the output $E_{ON}$ (corresponding to an output produced when the photodetector receives the light without being blocked) to maintain the same constant, in the present embodiment as shown in FIG. 8 the D/A converter 20 is used to control the current through the LED 8 to thereby maintain the output $E_{ON}$ constant.

In accordance with these embodiments of the present invention, as described hereinbefore, (i) a first output of the sensor means corresponding to an output of the sensor means as produced in a first state in which the light from the light emitting element of the sensor means is received by the light receiving element of the sensor means without being blocked and (ii) a second output of the sensor means corresponding to an output of the sensor means as produced in a second state in which the light reception of the light receiving element is completely blocked, are used to determine a set level for the positioning as well as a tolerance level therefor. Additionally, the set level and/or the tolerance level is renewed at a predetermined timing such as replacement of wafers, for example. This provides various advantageous effects such as follows:

(1) Even if there occurs a change in the sensitivity of a sensor means, high-precision positioning of each wafer at a determined position and in a determined direction is assured constantly.

(2) The sensitivity adjustment of the sensor means may be somewhat rough, and this leads to a reduction of the manufacturing cost.

(3) There is no necessity for re-adjustment for compensating for a change in sensitivity of the sensor means. This leads to a reduction of the maintenance cost.

While the invention has been described with reference to the structures disclosed herein, it is not confined to the details set forth and this application is intended to cover such modifications or changes as may come within the purposes of the improvements or the scope of the following claims.

What is claimed is:

1. An alignment system, comprising:
    sensor means including a pair of a light emitting element and a light receiving element, for detecting an edge of a substrate without contact therewith;
    driving means for supporting the substrate and for moving the substrate; and
    control means for controlling said driving means so as to position the substrate, wherein said control means controls said driving means so that said sensor means produces an output of a level which is within a predetermined tolerance range with respect to a set level, and wherein said control means is operable to renew said set level at a predetermined timing on the basis of (i) a first output of said sensor means corresponding to an output of said sensor means as produced in a first state in which light from said light emitting element of said sensor means is received by said light receiving element of said sensor means without being blocked and (ii) a second output of said sensor means corresponding to an output of said sensor means as produced in a second state in which the light reception of said light receiving element is completely blocked.

2. An alignment system according to claim 1, wherein said control means is further operable to renew said tolerance range on the basis of said first and second outputs of said sensor means.

3. An alignment system according to claim 1, wherein said control means causes said light emitting element to be turned off when said sensor means is not used.

4. An alignment system according to claim 1, wherein said control means includes means for holding said first output of said sensor means at a predetermined level.

5. A method of aligning a substrate, comprising the steps of:
    detecting a first output of a light receiving element produced when no light from a light emitting element is incident on the light receiving element;
    detecting a second output of the light receiving element produced when light from the light emitting element is incident on the light receiving element substantially without being blocked;

determining an alignment reference output level on the basis of the first and second outputs of the light receiving element;

detecting a third output of the light receiving element produced when light from the light emitting element is received by the light receiving element while the substrate is being moved by driving means; and controlling the driving means so that the third output has predetermined relationship with the alignment reference output level.

* * * * *

UNITED STATES PATENT AND TRADEMARK OFFICE
CERTIFICATE OF CORRECTION

PATENT NO. : 5,258,823
DATED : November 2, 1993
INVENTOR(S) : TAKAHIRO AKAMATSU

It is certified that error appears in the above-indentified patent and that said Letters Patent is hereby corrected as shown below:

SHEET 4 OF THE DRAWINGS
    In Fig. 7, "MAENS" (both occurrences) should read --MEANS--.

COLUMN 2
    Line 31, "said" should read --the--.
    Line 51, "with out" should read --without--.

COLUMN 6
    Line 4, "vents" should read --vent--.
    Line 19, "sensor" should read --sensor,--.
    Line 23, "said" should be deleted.
    Line 46, "tuned" should read --turned--.

COLUMN 8
    Line 7, "follows:" should read --follows.--.
    Line 27, "means" should read --means,--.

Signed and Sealed this

Thirty-first Day of May, 1994

Attest:

BRUCE LEHMAN

*Attesting Officer*    *Commissioner of Patents and Trademarks*